US012570521B2

(12) United States Patent     (10) Patent No.:    US 12,570,521 B2

Weber et al.          (45) Date of Patent:     Mar. 10, 2026

(54) MICROMECHANICAL COMPONENT FOR A SENSOR AND/OR MICROPHONE DEVICE

(71) Applicant: Robert Bosch GmbH, Stuttgart (DE)

(72) Inventors: Heribert Weber, Nuertingen (DE); Peter Schmollngruber, Aidlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 359 days.

(21) Appl. No.: 18/337,942

(22) Filed: Jun. 20, 2023

(65) Prior Publication Data

US 2023/0416079 A1     Dec. 28, 2023

(30) Foreign Application Priority Data

Jun. 23, 2022    (DE) ..................... 10 2022 206 287.6

(51) Int. Cl.
| | |
|---|---|
| *B81B 7/02* | (2006.01) |
| *B81C 1/00* | (2006.01) |
| *G01L 1/22* | (2006.01) |

(52) U.S. Cl.
CPC ............ *B81B 7/02* (2013.01); *B81C 1/00166* (2013.01); *G01L 1/2262* (2013.01); (Continued)

(58) Field of Classification Search
CPC ... G01L 9/0073; G01L 13/025; G01L 1/2262; G01L 1/142; G01L 9/12; G01L 13/06; (Continued)

(56) References Cited

U.S. PATENT DOCUMENTS

| | | | |
|---|---|---|---|
| 6,431,003 B1 * | 8/2002 | Stark ..................... | G01L 13/026 |
| | | | 73/718 |
| 2010/0170346 A1 * | 7/2010 | Opitz ................... | B81B 3/0078 |
| | | | 73/718 |

(Continued)

FOREIGN PATENT DOCUMENTS

| | | |
|---|---|---|
| DE | 102009000056 A1 | 7/2010 |
| DE | 102018222712 A1 | 6/2020 |

(Continued)

*Primary Examiner* — Moazzam Hossain

(74) *Attorney, Agent, or Firm* — NORTON ROSE FULBRIGHT US LLP

(57)         ABSTRACT

A micromechanical component for a sensor and/or microphone device. The component has an adjustable first actuator electrode suspended on a regionally deformable first layer, a first stator electrode fastened so that a first measuring signal is able to be tapped with regard to a first voltage or capacitance applied between the first actuator electrode and the first stator electrode, and a second actuator electrode, so that a second measuring signal is able to be tapped with regard to a second voltage or capacitance applied between the second actuator electrode and the first stator electrode or between the second actuator electrode and the second stator electrode. The second actuator electrode is situated in an adjustable manner on a side of the first actuator electrode facing away from the first layer in that the second actuator electrode is suspended on the first actuator electrode and/or an at least regionally deformable second layer.

8 Claims, 13 Drawing Sheets

(52) U.S. Cl.
  CPC ................ *B81B 2201/0257* (2013.01); *B81B*
        *2203/0127* (2013.01); *B81B 2203/0307*
        (2013.01); *B81B 2203/0315* (2013.01); *B81B*
        *2203/04* (2013.01); *B81C 2201/014* (2013.01)

(58) Field of Classification Search
  CPC . B81B 7/02; B81B 3/0021; B81B 2201/0257;
        B81B 2203/0127; B81B 2201/0264;
        B81B 2203/0307; B81B 2203/0315;
        B81B 2203/04; B81B 2201/02; B81C
        1/00166; B81C 2201/014; B81C 1/00134;
        B81C 1/00158; G01D 5/24; G01D 11/245
  See application file for complete search history.

(56)                  References Cited

U.S. PATENT DOCUMENTS

| | | |
|---|---|---|
| 2018/0335358 A1 | 11/2018 | Zheng |
| 2021/0108981 A1* | 4/2021 | Tokuda ................... G01L 19/04 |
| 2023/0228639 A1* | 7/2023 | Tsuji ..................... G01L 13/026 |
| | | 73/724 |

FOREIGN PATENT DOCUMENTS

| | | |
|---|---|---|
| DE | 102019205348 A1 | 10/2020 |
| DE | 102019205349 A1 | 10/2020 |

* cited by examiner

MICROMECHANICAL COMPONENT FOR A SENSOR AND/OR MICROPHONE DEVICE

CROSS REFERENCE

The present application claims the benefit under 35 U.S.C. § 119 of German Patent Application No. DE 10 2022 206 287.6 filed on Jun. 23, 2022, which is expressly incorporated herein by reference in its entirety.

FIELD

The present invention relates to a micromechanical component for a sensor and/or microphone device. In addition, the present invention relates to a production method for a micromechanical component for a sensor and/or microphone device.

BACKGROUND INFORMATION

German Patent Application No. DE 10 2018 222 712 A1 describes a micromechanical component for a capacitive pressure-sensor device, which has an actuator electrode suspended on a diaphragm and a stator electrode, which is fixed in place in a housing of the micromechanical component, the actuator electrode and the stator electrode being electrically contactable in such a way that a measuring signal with regard to a voltage or capacitance applied between the actuator electrode and the stator electrode can be tapped. In addition, the micromechanical component of German Patent Application No. DE 10 2018 222 712 A1 is developed with at least one counter-electrode and at least one allocated reference counter-electrode, which are electrically contactable in such a way that a reference signal can also be tapped with regard to a voltage or capacitance applied between the at least one counter-electrode and the at least one allocated reference counter-electrode in each case.

SUMMARY

The present invention provides a micromechanical component for a sensor and/or microphone device, and a production method for a micromechanical component for a sensor and/or microphone device.

An example embodiment of the present invention provides micromechanical components which, due to their development with not only a first actuator electrode suspended at an at least regionally deformable first layer but also with a second actuator electrode suspended at the first actuator electrode and/or at an at least regionally deformable second layer, can be used for a multitude of different pressure sensor variants. In particular, the present invention realizes a functional-layer level design and a corresponding production process in which a virtually identical layer development may be used for different pressure sensor variants. Thus, the present invention is able to be used not only for the development of novel sensor and/or microphone devices but also contributes to the simplification and to a cost reduction in the production of a broad spectrum of sensor and/or microphone devices.

A sensor and/or microphone device realized with the aid of the present invention, for instance, may be a microphone, a multi-function sensor, a pressure sensor and/or acceleration sensor, a differential-pressure sensor, a multi-pressure sensor, a differential capacitive sensor (having two variable capacities), and a fully differential capacitive sensor (having four variable capacities). As a result, the present invention is able to be used in a wide variety of applications.

In a further advantageous embodiment of the micromechanical component of the present invention, the first layer has a first flexural stiffness, which deviates from a second flexural stiffness of the second layer. Thus, a first characteristic curve of a first detection unit, which includes the first layer, the first actuator electrode and the first stator electrode, and a second characteristic curve of a second detection unit, which includes the second layer, the second actuator electrode and the first/second stator electrode, may deviate from one another. For instance, the described embodiment of the micromechanical component can be used to measure different pressure regions with the aid of the different characteristic curves of the first detection unit and the second detection unit.

In a further advantageous embodiment of the micromechanical component of the present invention, the at least one first suspension structure is mechanically linked with the at least one second suspension structure in such a way that the first layer is coupled with or connected to the second layer in an electrically conductive or an electrically insulating manner. Optionally, the at least one first suspension structure may (mechanically) contact/touch the respective allocated second suspension structure, or the at least one first suspension structure may be fixed in place via an insulation region to the respective allocated second suspension structure. This increases the usability of the described embodiment of the micromechanical component.

For example, the first stator electrode may be positioned between the first actuator electrode and the first layer, and the at least one first suspension structure may extend through at least one first opening developed in the first stator electrode, and the second actuator electrode is electrically contactable with the second stator electrode such that the second measuring signal is able to be tapped with regard to the second voltage or capacitance applied between the second actuator electrode and the second stator electrode. The embodiment of the micromechanical component described here thus has a design in which the positioning of the first stator electrode does not have any adverse effect on an operating capacitance of the second detection unit that includes the second layer, the second actuator electrode, and the second stator electrode.

In an advantageous manner, the second stator electrode may lie between the second actuator electrode and the second layer, and the at least one second suspension structure may extend through at least one second opening developed in the second stator electrode. The described positioning of the second stator electrode thus also has no adverse effect on the operating capacity of the first detection unit that includes the first layer, the first actuator electrode and the first stator electrode.

As a further advantage, the micromechanical component according to an example embodiment of the present invention may additionally include a third stator electrode, which is fixed in place on and/or in the housing structure and lies between the first actuator electrode and the second actuator electrode, the first actuator electrode being electrically contactable with the third stator electrode such that a third measuring signal with regard to a third voltage or capacitance applied between the first actuator electrode and the third stator electrode is able to be tapped, and the second actuator electrode is electrically contactable with the third stator electrode such that a fourth measuring signal with regard to a fourth voltage or capacitance applied between the second actuator electrode and the third stator electrode is able to be tapped. The described advantageous refinement of the micromechanical component thus has an electrode design in which the third stator electrode is able to interact both with the first actuator electrode and the second actuator electrode.

Alternatively, the second stator electrode may lie between the first actuator electrode and the second actuator electrode. This is advantageous if a positioning of the second stator electrode between the second actuator electrode and the second layer is undesired.

In a further advantageous embodiment of the micromechanical component of the present invention, the first stator electrode lies between the first actuator electrode and the second actuator electrode, and the second actuator electrode is electrically contactable with the first stator electrode such that the second measuring signal is able to be tapped with regard to the second voltage or capacitance applied between the second actuator electrode and the first stator electrode. The described micromechanical component thus has an electrode design that allows the first stator electrode to interact both with the first actuator electrode and the second actuator electrode.

The above-described advantages are also ensured when carrying out a corresponding production method for a micromechanical component for a sensor and/or microphone device. It is expressly pointed out that the production method is able to be further refined according to the afore-described embodiments of the micromechanical components.

BRIEF DESCRIPTION OF THE DRAWINGS

Further features and advantages of the present invention will be described in the following text with the aid of the figures.

DETAILED DESCRIPTION OF EXAMPLE
EMBODIMENTS

Figure 1A:
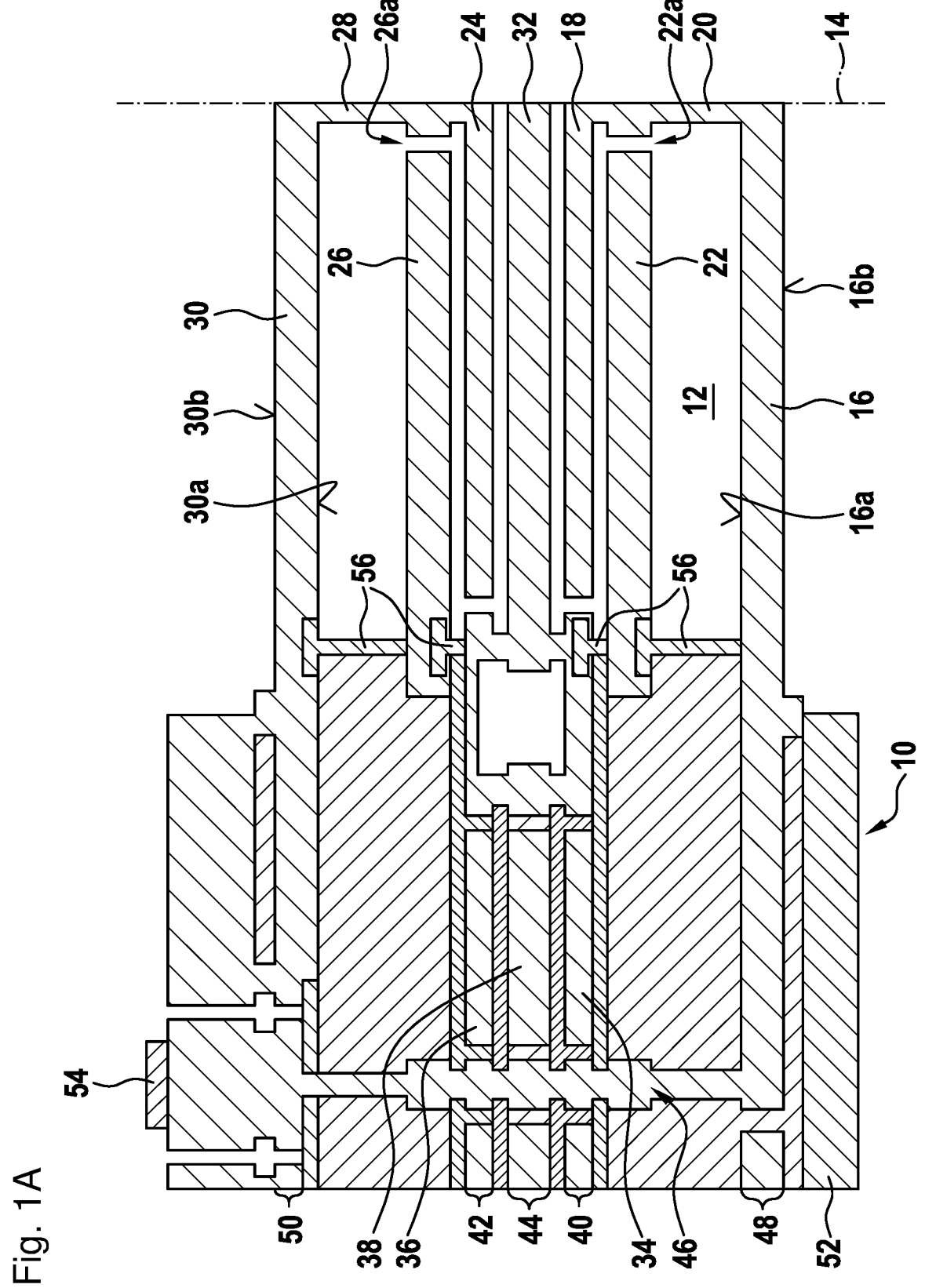
FIGS. 1A and 1B show a schematic partial representation and a circuit diagram of a first embodiment of the micromechanical component of the present invention.
Figure 1B:
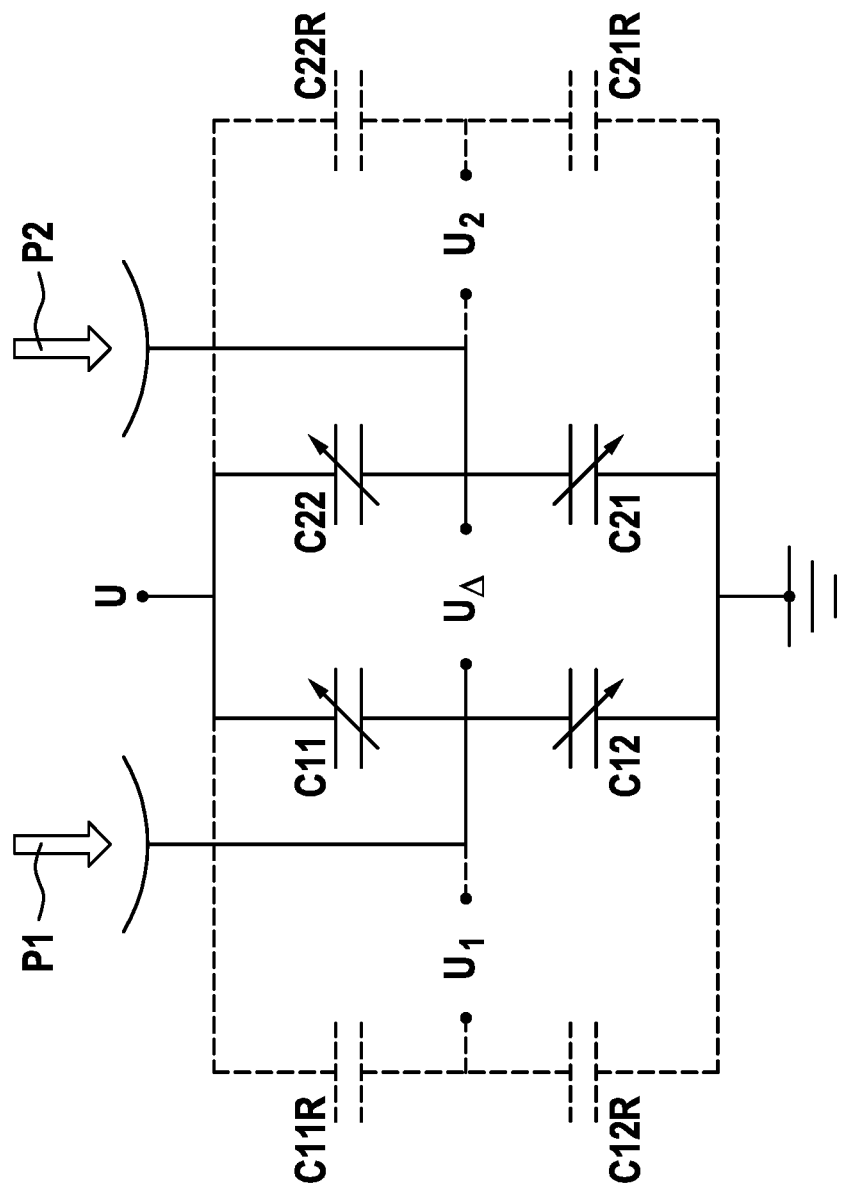

FIGS. 1A and 1B show a schematic partial illustration and a circuit diagram of a first embodiment of the micromechanical component.

The micromechanical component schematically reproduced in part in FIG. 1A has a housing structure 10 in which a cavity region 12 is developed. Since housing structure 10, cavity region 12 and the components of the micromechanical components developed therein (described in the following text) are developed in mirror symmetry with a symmetry plane 14, a full representation of the micromechanical component has been dispensed with in FIG. 1A.

Cavity region 12 is restricted by an at least regionally deformable first layer 16, which may particularly be embodied as a first diaphragm 16. A first actuator electrode 18 is mechanically suspended (especially in an electrically conductive manner) via at least one first suspension structure 20 on first layer 16, in particular on a first inner side 16a of first layer 16 aligned toward cavity region 12, in such a way that first actuator electrode 18 is adjustable/adjusted in relation to housing structure 10 with the aid of an at least regional warping of first layer 16. A first stator electrode 22 is fastened to and/or in housing structure 10 in such a way that a position or an adjustment of first stator electrode 22 in relation to housing structure 10 will not be modified in a warping of first layer 16. In addition, first actuator electrode 18 and first stator electrode 22 are electrically contactable with each other such that a first measuring signal is able to be tapped with regard to a first voltage or capacitance applied between first actuator electrode 18 and first stator electrode 22. With the aid of first actuator electrode 18 and first stator electrode 22, a first detection unit C11 is realized as a result. If first stator electrode 22 is situated directly adjacent to first layer 16, then a clearance between first stator electrode 22 and first layer 16 is preferably greater than or equal to a clearance between first actuator electrode 18 and first stator electrode 22.

In addition, the micromechanical component of FIGS. 1A and 1B also includes a second actuator electrode 24, which is electrically contactable with first stator electrode 22 and/or a second stator electrode 26 fixed in place on and/or in housing structure 10 in such a way that a second measuring signal is able to be tapped with regard to a second voltage or capacitance applied between second actuator electrode 24 and first stator electrode 22 or between second actuator electrode 24 and second stator electrode 26. Second actuator electrode 24 is situated on a side of first actuator electrode 18 facing away from first layer 16. This allows for a mechanical (electrically conductive or electrically insulating) linkage of second actuator electrode 24 via at least one second suspension structure 28 with first actuator electrode 18 and/or an at least regionally deformable second layer 30, so that (in the case of a linkage of second actuator electrode 24 with the first actuator electrode 18 via the at least one second suspension structure 28), the second actuator electrode 24 is adjustable/adjusted in relation to housing structure 10 by way of an at least regional warping of first layer 16, or (in the case of a suspension of second actuator electrode 24 via the at least one second suspension structure 28 on the second layer 30) is adjustable/adjusted in relation to the housing structure 10 by way of an at least regional warping of second layer 30.

The micromechanical component of FIGS. 1A and 1B thus has a design of a functional layer level that can be used for a multitude of different pressure sensor variants. Variations of the micromechanical component as described in the further text may thus be used for a corresponding multitude of applications.

By way of example, in the micromechanical component of FIGS. 1A and 1B, second actuator electrode 24 and second stator electrode 26 are electrically contactable in such a way that the second measuring signal is able to be tapped with regard to the second voltage or capacitance applied between second actuator electrode 24 and second stator electrode 26. Second actuator electrode 24 and second stator electrode 26 thus form a second detection unit C22.

By way of example, second actuator electrode 24 of the micromechanical component of FIGS. 1A and 1B is suspended at second layer 30, which lies on a side of second actuator electrode 24 facing away from first actuator electrode 18, especially on a second inner side 30$a$ of second layer 30 aligned toward cavity region 12. Second layer 30 may also be developed as a second diaphragm 30. First layer 16 and second layer 30 are preferably developed separately from one another such that layers 16 do not mechanically contact/touch. In this way, a first pressure p$_1$ acting on a first external side 16$b$ of first layer 16 facing away from first inner side 16$a$ has no effect on second layer 30, while a second pressure p$_2$ acting on a second external side 30$b$ of second layer 30 facing away from second inner side 30$a$ does not lead to any (additional) deformation of first layer 16. A may be gathered from the following description, the micromechanical component of FIGS. 1A and 1B may therefore be used in an advantageous manner as a differential pressure sensor for measuring a differential pressure Δp between first pressure p$_1$ and second pressure p$_2$.

In the embodiment of FIGS. 1A and 1B, first stator electrode 22 is situated between first actuator electrode 18 and first layer 16 by way of example, and the at least one first suspension structure 20 extends through at least one first opening 22$a$ developed in first stator electrode 22. A clearance between first stator electrode 22 and first layer 16 is preferably greater than or equal to a clearance between first actuator electrode 18 and first stator electrode 22. As an alternative, however, first stator electrode may also lie between first actuator electrode 18 and second actuator electrode 24. Such a positioning of first stator electrode 22 also makes it possible to dispense with providing second stator electrode 26 to the micromechanical component in that second actuator electrode 24 is developed as electrically contactable with first stator electrode 22 such that the second measuring signal is able to be tapped with regard to the second voltage or capacitance applied between second actuator electrode 24 and first stator electrode 22.

However, if second stator electrode 26 is provided on the micromechanical component, second stator electrode 26 may be placed or is placed between second actuator electrode 24 and second layer 30 by guiding the at least one second suspension structure 28 through at least one second opening 26$a$ developed in second stator electrode 26.

In this case, too, a clearance between second stator electrode 26 and second layer 30 is preferably greater than or equal to a clearance between second actuator electrode 24 and second stator electrode 26. As an alternative, second stator electrode 26 may also lie between first actuator electrode 18 and second actuator electrode 24.

As an optional refinement, the micromechanical component of FIGS. 1A and 1B also has a third stator electrode 32, which is fixed in place on and/or in housing structure 10 of the micromechanical component. In an advantageous manner, third stator electrode 32 may lie between first actuator electrode 18 and second actuator electrode 24 so that third stator electrode 32 is able to interact both with first actuator electrode 18 (as third detection unit C12) and with second actuator electrode 24 (as fourth detection unit C21). Via a corresponding electrical contacting between first actuator electrode 18 and third stator electrode 32, a third measuring signal is able to be tapped with regard to a third voltage or capacitance applied between first actuator electrode 18 and third stator electrode 32. Thus, a fourth measuring signal with regard to a fourth voltage or capacitance applied between second actuator electrode 24 and third stator electrode 32 can likewise be tapped via a corresponding electrical contacting of second actuator electrode 24 with third stator electrode 32.

As optional supplementations, at least one first reference electrode 34, at least one second reference electrode 36, and/or at least one reference counter-electrode 38 may be developed on the micromechanical component. By structuring the at least one first reference electrode 34 together with first actuator electrode 18 out of a shared electrode-material layer 40, structuring the at least one second reference electrode 36 together with second actuator electrode 24 out of a shared electrode-material layer 42, and structuring the at least one reference counter-electrode 38 together with third stator electrode 32 out of a shared electrode material layer 44, electrodes 34, 36 and 38 may advantageously be positioned in such a way relative to one another that they are able to be used as reference-detection units C11R, C12R, C21R and C22R for reliable reference measurements.

As may furthermore be gathered from FIG. 1A, the micromechanical component may be developed with at least one through-contact 46, which extends from a first diaphragm-material layer 48 from which first layer 16 is formed, and/or from a shared electrode material layer 40, 42 and/or 44 up to a second diaphragm-material layer 50, from which second layer 30 is formed. On a side of the micromechanical component facing away from a substrate 52 of the micromechanical component, the at least one through-contact 46 may be electrically contactable via an individual bond pad 54. The at least one lateral etch-stop structure 56 of the micromechanical component of FIGS. 1A and 1B will be addressed in the further text.

As may be gathered from FIG. 1B, electrodes 18, 22, 24, 26 and 32 through 38 shown in FIG. 1A can thereby be interconnected to form up to three combined/interconnected Wheatstone bridge circuits. In this way, differential pressure Δp between first pressure p$_1$ and second pressure p$_2$ (by evaluation of the tapped voltage U$_A$) as well as associated individual pressures p$_1$ and p$_2$ (by an evaluation of tapped voltages U$_1$ and U$_2$) are able to be measured with a relatively high measuring sensitivity. Very advantageously, the micromechanical component of FIGS. 1A and 1B is therefore suitable for a differential pressure sensor. In comparison with a conventional differential pressure sensor, the use of the described micromechanical component thus makes it possible to ascertain not only differential pressure Δp between two pressure regions, but also the associated individual pressures p$_1$ and p$_2$ (by evaluating the tapped voltages U$_1$ and U$_2$), so that no additional pressure sensors for ascertaining individual pressures p$_1$ and/or p$_2$ are required.

With the aid of the micromechanical component of FIGS. 1A and 1B having the two at least regionally deformable layers 16 and 30 and the two differential-capacitor arrays, for example, the individual pressures p$_1$ and p$_2$ in two different volumes are able to be measured independently of one another, and differential pressure Δp between the two volumes can be determined by subtracting the measured pressures p$_1$ and p$_2$ from one another. However, it is also possible to measure differential pressure Δp and one of individual pressures p$_1$ or p$_2$, and to determine the respective other individual pressure on that basis.

As an advantageous refinement, first layer 16 may also have a first flexural stiffness that deviates from a second flexural stiffness of second layer 30. In this case, measured pressures $p_1$ and $p_2$ and/or differential pressure $\Delta p$, even if they lie in different value ranges, are still able to be determined in a reliable manner with the aid of a corresponding optimization of the flexural stiffness of respective first/ second layer 16 and 30. As an alternative, however, the first flexural stiffness of first layer 16 may also be (virtually) equal to the second flexural stiffness of second layer 30.

Figure 2:
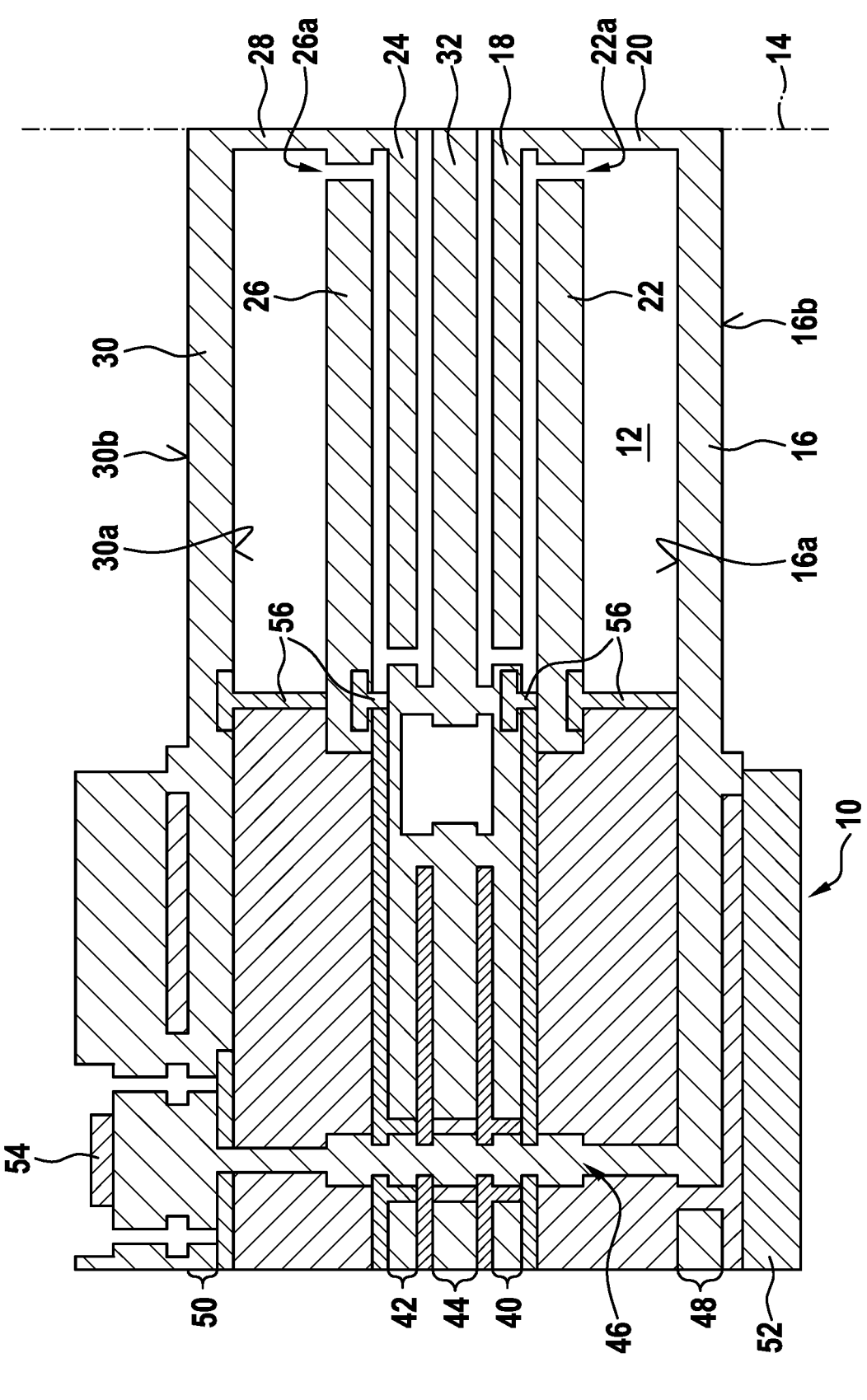
FIG. 2 shows a schematic partial representation of a second embodiment of the micromechanical component of the present invention.

FIG. 2 shows a schematic partial representation of a second embodiment of the micromechanical component.

As may be gathered from FIG. 2, the at least one bond pad 54 may also be developed as a recessed bond pad 54. Even a seal (not shown) of at least one etching access (not sketched) is able to be developed in recessed form in relation to an external surface of the micromechanical component facing away from substrate 52. In this way, it can be avoided that the at least one bond pad 54 and/or the at least one seal of the at least one etching access come(s) into contact with a chuck, a wafer support, a handling system, and/or a pick-and-place tool during the production process. In addition, a development of electrodes 34, 36 and 38 may be omitted.

With regard to further features of the embodiment of FIG. 2 and its advantages, reference is made to the above-described micromechanical component of FIGS. 1A and 1B.

Figure 3A:
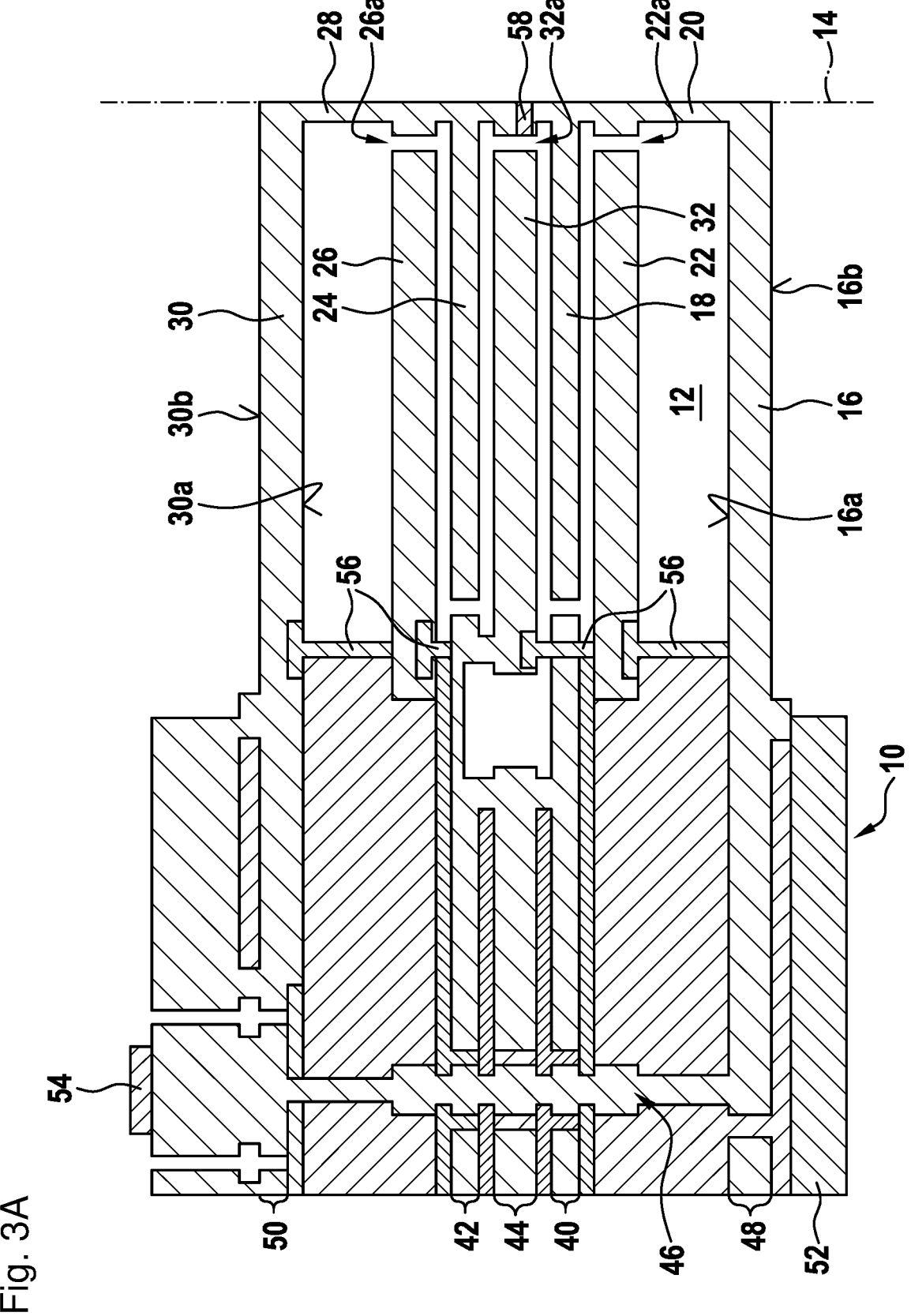
FIGS. 3A and 3B show a schematic partial representation and a circuit diagram of a third embodiment of the micromechanical component of the present invention.
Figure 3B:
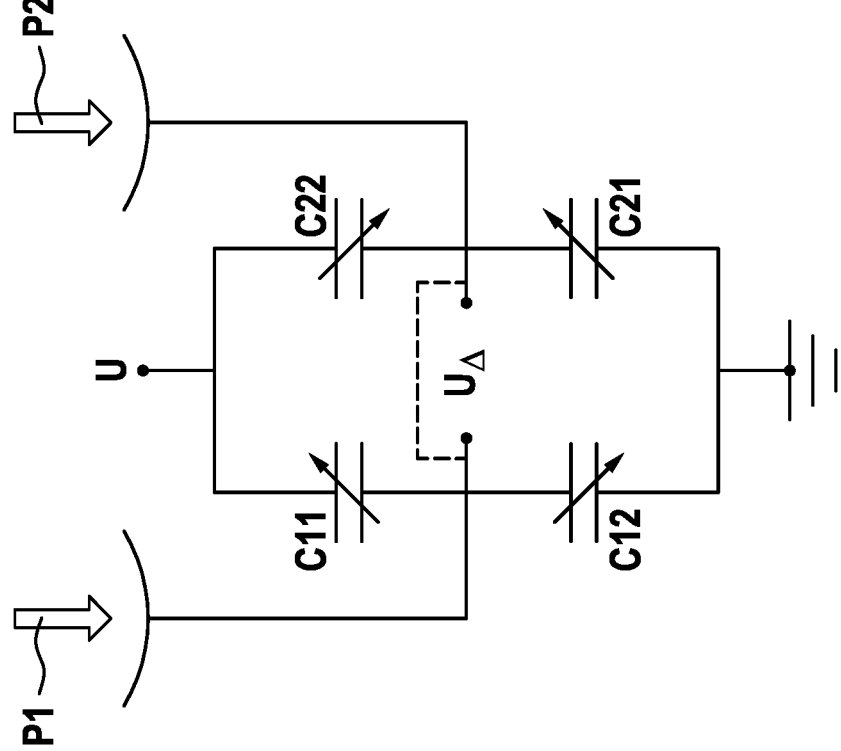

FIGS. 3A and 3B show a schematic partial representation and a circuit diagram of a third embodiment of the micro-mechanical component.

In the micromechanical component of FIGS. 3A and 3B, the at least one first suspension structure 20 and the at least one second suspension structure 28 are mechanically linked with one another. However, an insulation region 58 is developed between the at least one first suspension structure 20 and the at least one second suspension structure 28 in each case, which is made from at least one electrically insulating material exhibiting a high etching resistance with regard to an etching medium that is used to etch the at least one sacrificial layer material (which will be described in greater detail in the further text). As a result, first actuator electrode 18 and second actuator electrode 24 are electrically insulated from each other despite their mechanical linkage. The at least one insulation region 58 is preferably made from a silicon-rich silicon nitride, whereas silicon dioxide is used as the at least one sacrificial layer material, and HF, preferably gaseous HF, is used as the etching medium. If required, the entire suspension structure may be made up of the at least one first suspension structure 20 (movably developed because of the at least one opening 22a in first stator electrode 22), of at least one movable subre- gion of third stator electrode 32 (because of at least one circumferential opening 32a in third stator electrode 32), of the at least one second suspension structure 28 (movably developed because of the at least one opening 26a in second stator electrode 26), and of insulation region 58.

Because of the mechanical coupling, developed in an electrically insulating manner, of first actuator electrode 18 with second actuator electrode 26, the micromechanical component shown in FIG. 3B by its electrical circuit diagram is a pure differential pressure sensor, which does not provide any information about the individual pressures $p_1$ and $p_2$ associated with differential pressure $\Delta p$. Electrodes 18, 22, 24, 26 and 32 are connected to form a Wheatstone bridge circuit so that a full bridge circuit having a maximum measuring sensitivity of differential pressure $\Delta p$ is realized. The dashed line in FIG. 3B describes the mechanical cou- pling, implemented in an electrically insulating manner, between first diaphragm 16 and second diaphragm 30.

With regard to further features of the embodiment of FIGS. 3A and 3B and its advantages, reference is made to the description of FIGS. 1A, 1B, and 2.

Figure 4A:
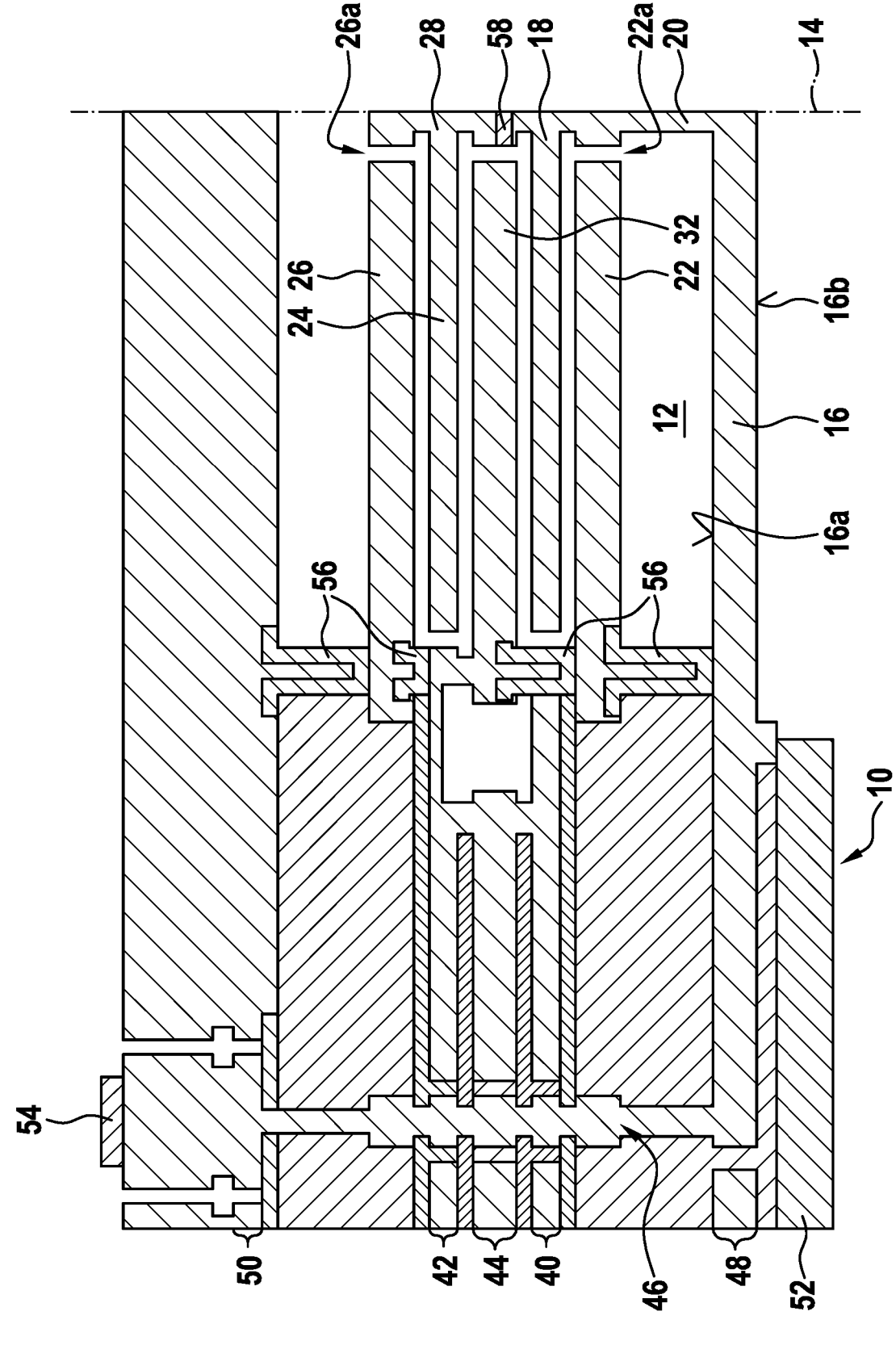
FIGS. 4A and 4B show a schematic partial representation and a circuit diagram of a fourth embodiment of the micromechanical component of the present invention.
Figure 4B:
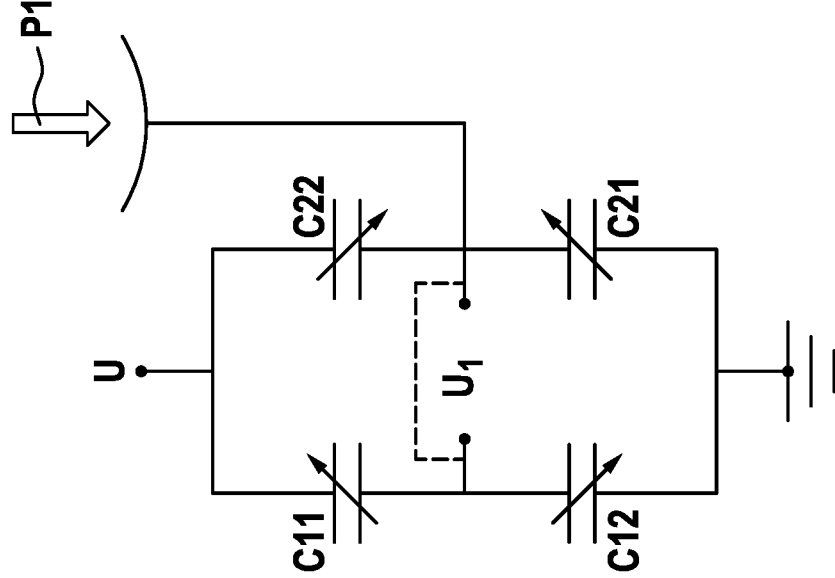

FIGS. 4A and 4B show a schematic partial representation and a circuit diagram of a fourth embodiment of the micro-mechanical component.

In contrast to the above-described embodiments, second actuator electrode 24 in the micromechanical component of FIGS. 4A and 4B is connected to first layer 16 via a subregion of the at least one second suspension structure 28, the at least one insulation region 58, first actuator electrode 18, and the at least one first suspension structure whereas a suspension of second actuator electrode 24 at second layer 30 is omitted. As may be gathered from FIG. 4B, this realizes a fully differential capacitive pressure sensor, whose four variable detection units C11, C12, C21 and C22 are interconnected to form a Wheatstone full bridge. This allows for a maximum measuring sensitivity when pressure mea- surements for detecting first pressure $p_1$ are carried out.

Alternatively, first actuator electrode 18 may also be connected to second layer 30 via a subregion of the at least one first suspension structure 20, the at least one insulation region 58, second actuator electrode 24, and the at least one second suspension structure 28, whereas a suspension of first actuator electrode 18 at first layer 16 is omitted. As described above, this makes it possible to realize a fully differential capacitive pressure sensor whose four variable detection units C11, C12, C21 and C22 are interconnected to form a Wheatstone full bridge. This allows for a maximum measuring sensitivity when pressure measurements are car- ried out for detecting a second pressure $p_2$.

With regard to further features of the embodiment of FIGS. 4A and 4B and their advantages, reference is made to the description of FIGS. 1A to 3B.

Figure 5:
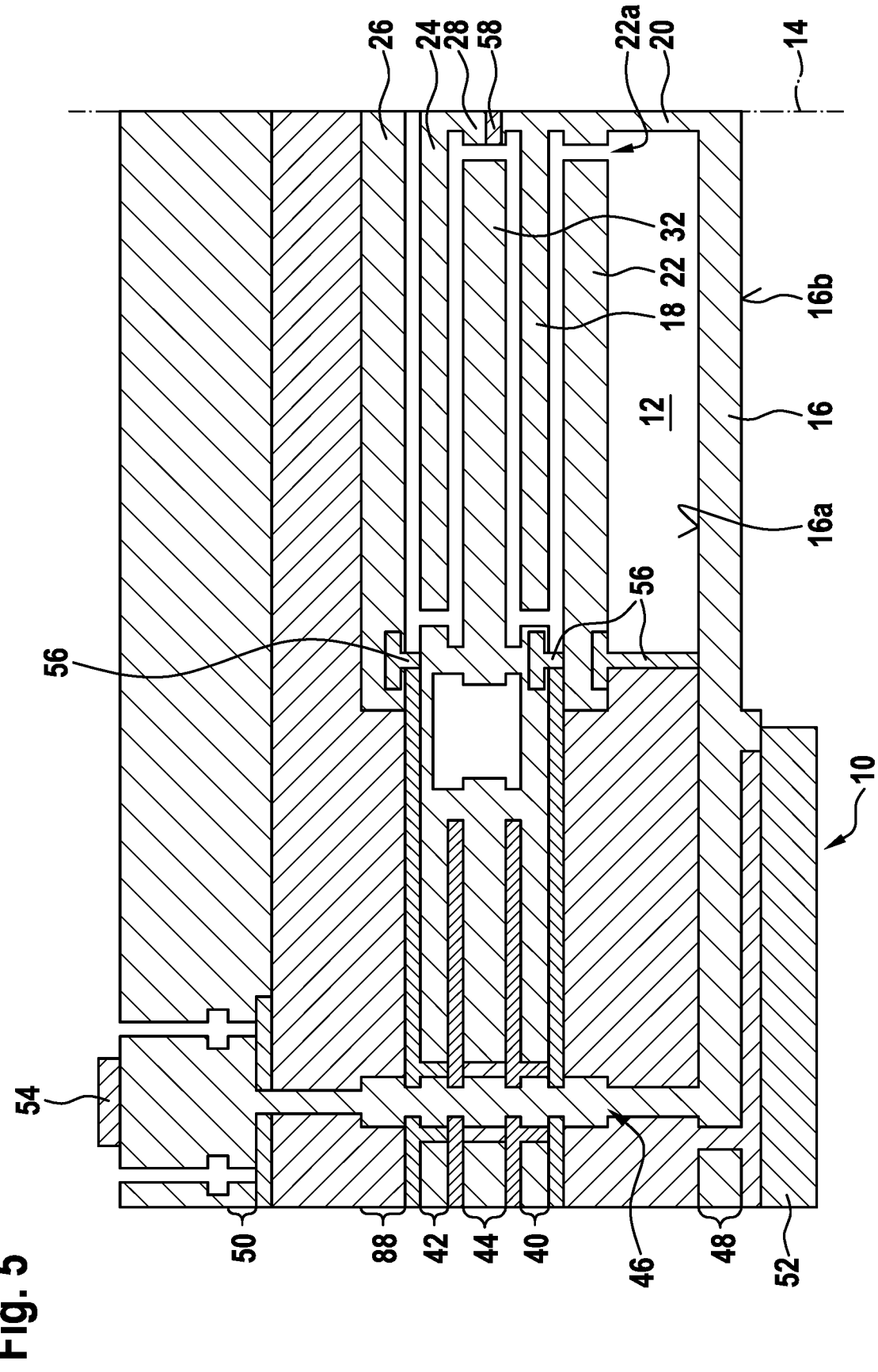
FIG. 5 shows a schematic partial representation of a fifth embodiment of the micromechanical component of the present invention.

FIG. 5 shows a schematic partial representation of a fifth embodiment of the micromechanical component.

The micromechanical component of FIG. 5 differs from the above-described embodiment merely in the shape of its at least one lateral etch-stop structure 56 and in an embed- ding of second stator electrode 26, on its side facing away from second actuator electrode 24, in the at least one sacrificial layer material. In this case, for example, an electrical connection of second actuator electrode 24 is able to be realized via a flexibly developed circuit trace structure between actuator electrode 24 and a circuit trace structure in electrode-material layer 88 (developed below).

With regard to further features of the embodiment of FIG. 5 and its advantages, reference is made to the description of FIGS. 1A through 4B.

All above-described micromechanical components have a virtually identical layer structure by which different pressure sensor concepts are implementable in an (essentially) iden- tical production process. In addition, in all above-described micromechanical components, a respective clearance between each of actuator electrodes 18 and 24 and stator electrode 22, 32 and 26 situated closest to it can be specified in such a way that non-linear contributions to the respective measurement signal and/or parasitic capacitances are heav- ily reduced or avoided.

For instance, the afore-described micromechanical com- ponents are able to be used in smartphones, tablets, wear- ables, hearables, AR and VR, drones, gaming devices, toys, robots, and in the smart home field. Apart from that, the components can be used in an industrial context such as for an HMI (human/machine interface) functionality, e.g., a multi-tap detection, an activity, gesture and context detec- tion, a user detection, movement control, cardan system, altitude and position stabilization, flight control, image stabilization, inside and outside navigation, floor detection, position tracking and route recording, PDR (pedestrian coupling navigation), dynamic route planning, detection of restrictions and obstacles, indoor SLAM (simultaneous localization and mapping), break-in monitoring, real-time movement detection, real-time movement tracking, activity tracking, and as calorie counters. In the same way, the afore-described micromechanical components may be used for logistics, the tracking of parts, an energy management and energy-saving measurements, anticipatory servicing, air-quality and climate monitoring, mold detection, water level detection, and for the fusion of sensor data. In the context of automotive applications, the afore-described micromechanical components are able to be used for a crash detection, e.g., in airbag systems, navigation applications, an engine control optimization, and for optimizing the combustion processes in gasoline- or diesel-operated engines.

Figure 6A:
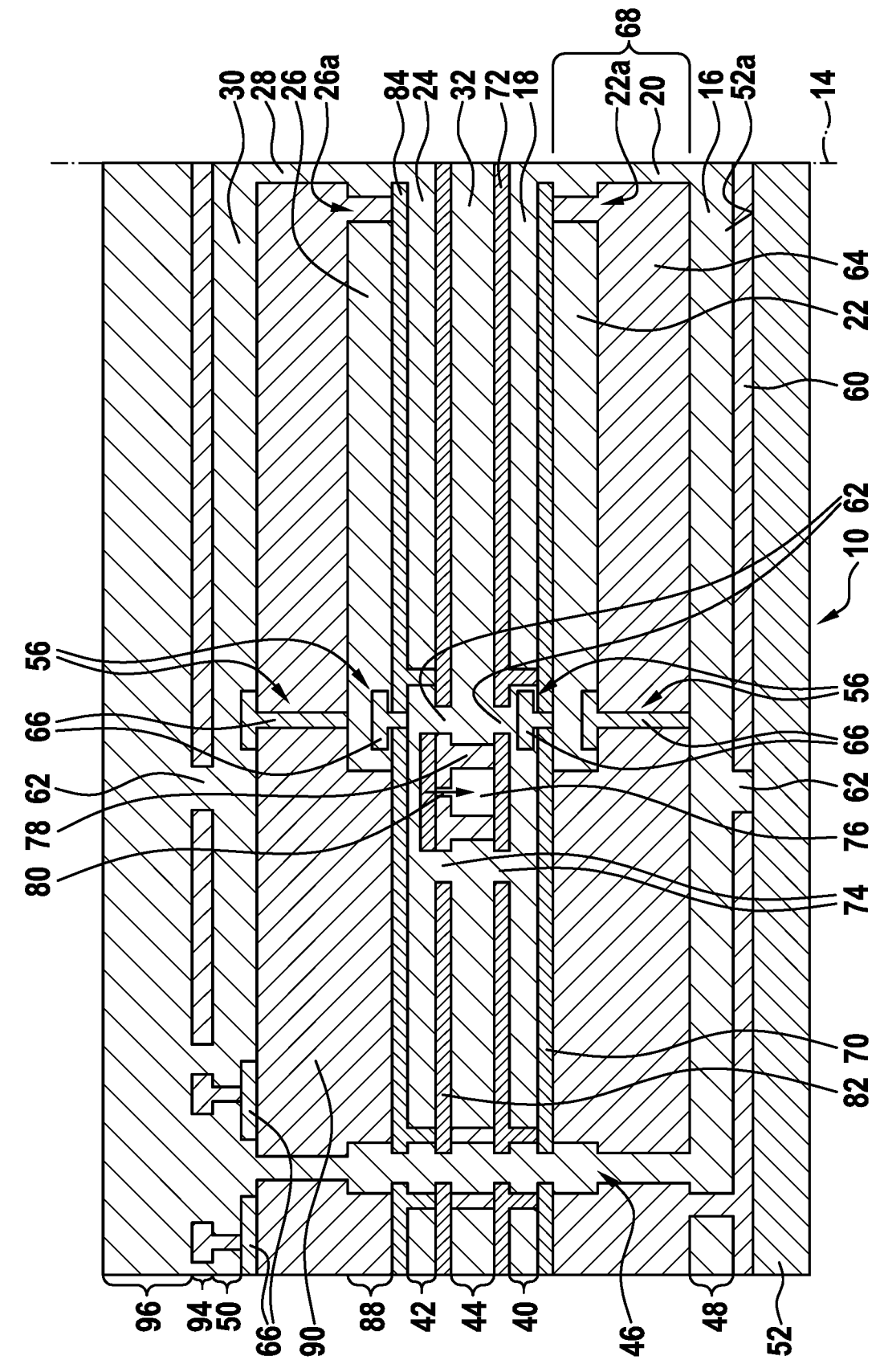
FIGS. 6A to 6C show schematic partial representations of intermediate products to describe a first embodiment of the production method for a micromechanical component of the present invention.
Figure 6B:
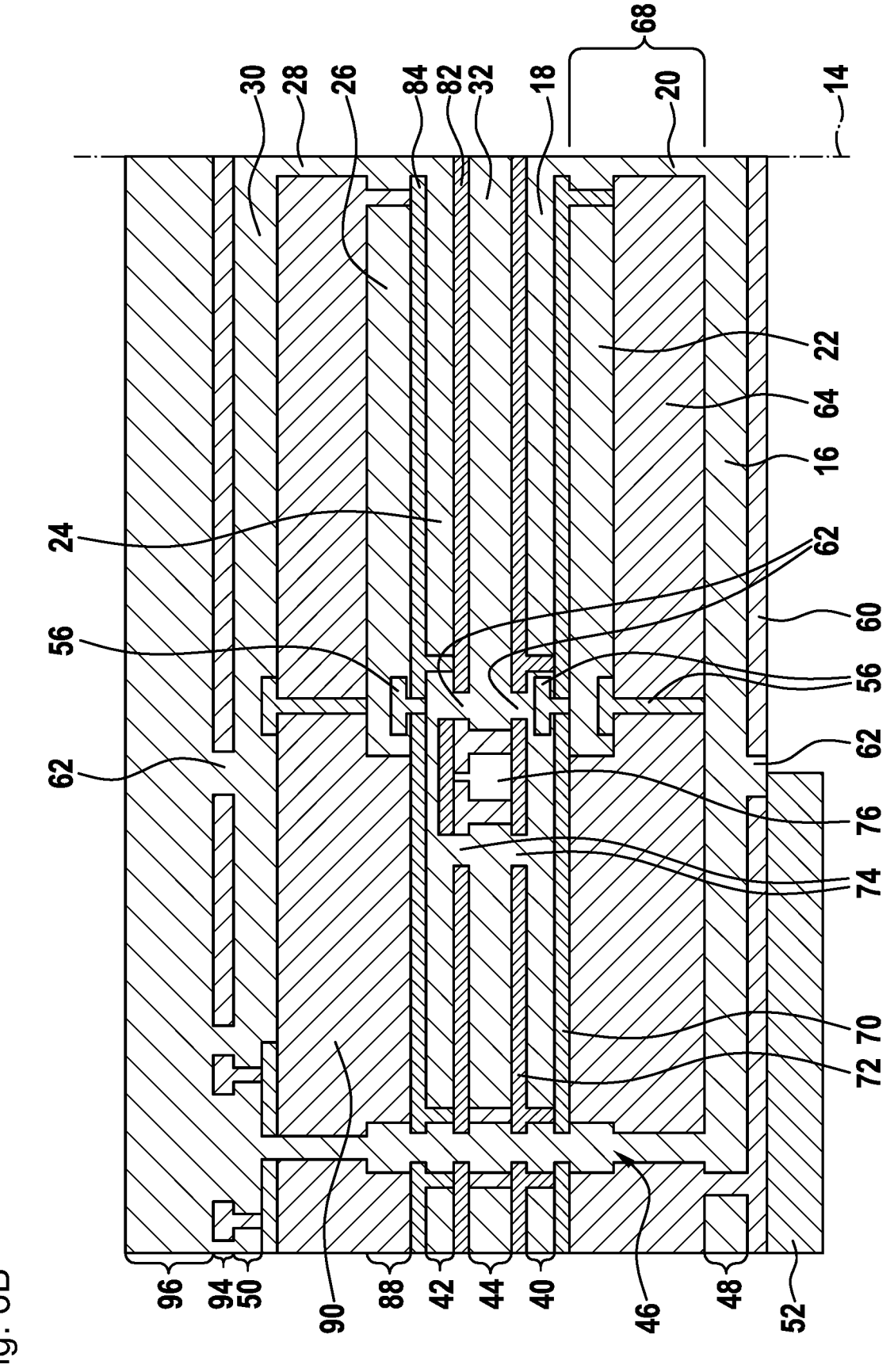
Figure 6C:
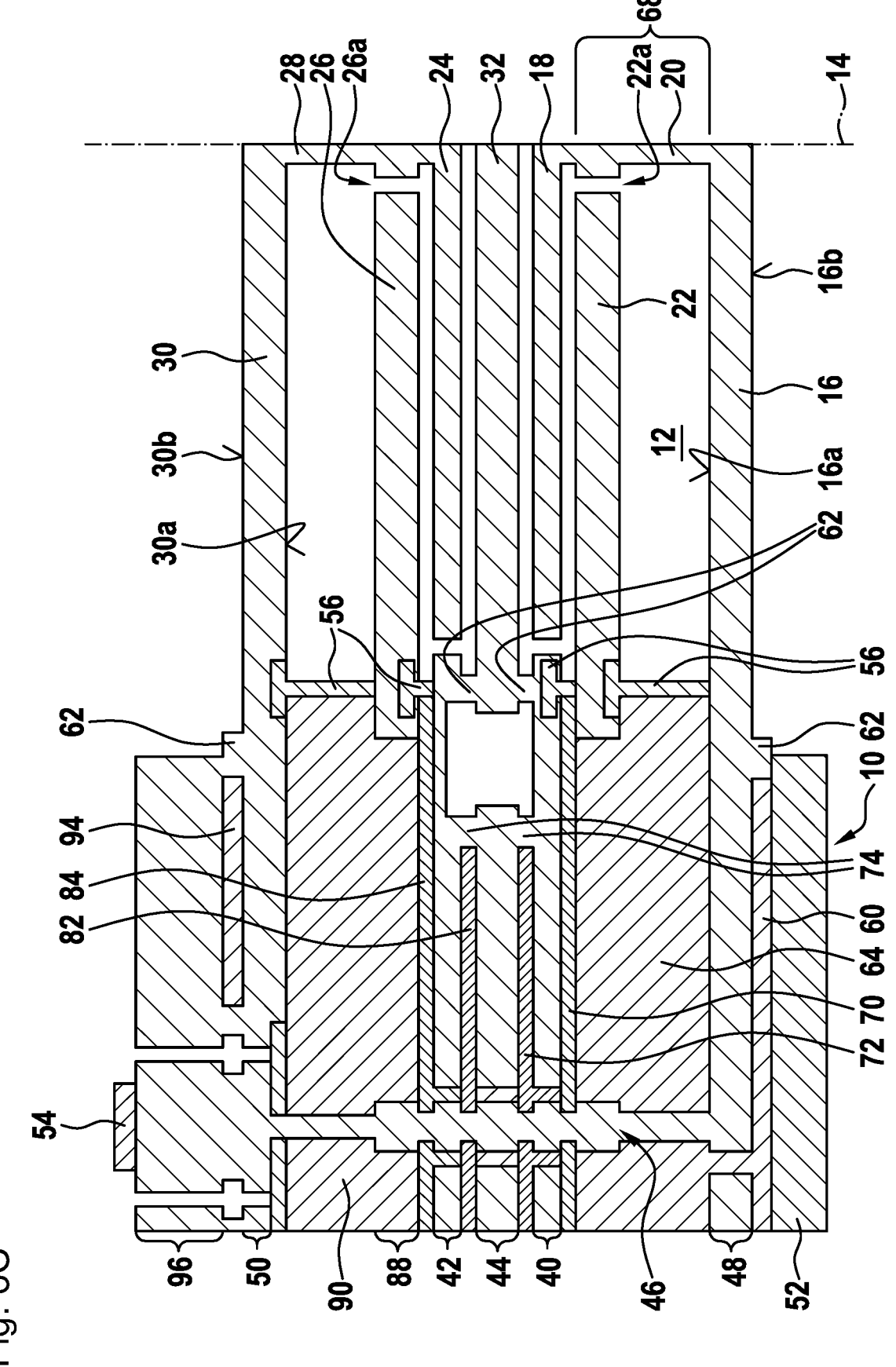

FIGS. 6A to 6C show schematic partial representations of intermediate products to describe a first embodiment of the production method for a micromechanical component.

With the aid of the production method described in the following text, (essentially) all the afore-described embodiments of the micromechanical component are able to be produced. However, it is pointed out that an executability of the production method described in the following text is not restricted to the production of such a micromechanical component.

In the described embodiment of the production method, a first layer 16 on a substrate 52 such as a silicon substrate is defined at the outset. A substrate surface 52a of substrate 52 is at least partially covered by a first sacrificial layer 60 for this purpose, preferably by a silicon dioxide layer. At a later point, first sacrificial layer 60 may optionally also be used for the electric insulation of at least one circuit trace structure of first layer 16. In addition, first sacrificial layer 60 is able to be used as an etch-stop layer when first layer 16 is subsequently exposed (by removing parts of substrate 52). If desired, at least one lateral etch-stop structure 62 may be developed in first layer 16 prior to the deposition of first diaphragm-material layer 48 on first sacrificial layer 60 in that at least one uninterrupted recess, which surrounds at least a subsequent cavity region 12, is structured through first sacrificial layer 60. An electrical contacting of substrate 52 may also be implemented in this way.

First diaphragm-material layer 48 deposited on first sacrificial layer 60 may be a polysilicon layer, for instance. Appropriate structuring of first diaphragm-material layer 48 makes it possible to selectively develop the later first layer 16 in this plane and possibly also at least one circuit trace structure. Next, a second sacrificial layer 64, for instance a silicon dioxide layer, is deposited on structured second diaphragm-material layer 48. At least parts of second sacrificial layer 64 developed in this way form a subregion of later cavity region 12 situated between first layer 16 and first stator electrode 22.

Using at least one uninterrupted recess structured through second sacrificial layer 64, a form and position of a subsection of the later first suspension structure 20 and/or a form and position of a subsection of at least one later through-contact 46 is/are able to be specified. For a later etching step to expose cavity region 12 from the sacrificial-material layer of second sacrificial layer 64, at least one lateral etch-stop structure 56, which circumferentially surrounds at least cavity region 12, is able to be formed in second sacrificial layer 64. At least one further uninterrupted recess may be structured through second sacrificial layer 64 for this purpose, which is subsequently at least partially filled with an etch-stop material 66. An etch-stop material 66 may be understood as an electrically insulating material and/or an electrically conductive material that offers a high etch resistance with regard to a subsequently used etching medium in comparison with the at least one sacrificial layer material. If silicon dioxide is used as the sacrificial layer material, then silicon-rich silicon nitride and/or silicon can be used as etch-stop material 66.

Next, a first electrode-material layer 68 is able to be deposited on structured second sacrificial layer 64 and optionally planarized, from whose material second stator electrode 22, the subsection of the later first suspension structure 20, the subsection of the at least one later through-contact 46, and/or at least one circuit trace structure is/are formed. First electrode-material layer 68 may be a polysilicon layer, for example. Prior to depositing first electrode-material layer 68 of polysilicon, an additional polysilicon layer and a layer of etch-stop material 66 are preferably still deposited. The use of the additional polysilicon layer underneath the layer of etch-stop material 66 makes it possible to prevent that the etch-stop material of second sacrificial 64 will be exposed to slight etching during the structuring of the layer of etch-stop material 66. However, since it is also possible to dispense with the use of an additional polysilicon layer, it is not depicted in FIGS. 6A to 6C. Given appropriate structuring of first electrode-material layer 68, it is optionally possible to structure also at least one first opening 22a developed in first stator electrode 22.

Next, structured first electrode-material layer 68 is covered with a third sacrificial layer 70, preferably a silicon-dioxide layer. An additional silicon dioxide layer may optionally be deposited on structured first electrode-material layer 68 before third sacrificial layer 70 of silicon dioxide is deposited, which can be planarized with the aid of a CMP method in order to fill with the additional silicon dioxide regions in which first electrode-material layer 68 is removed, to superficially expose structured regions of first electrode-material layer 68 again, and to achieve a planar surface. (A planar surface has the advantage of allowing for the subsequent use of thin photoresists in order to produce tiny structures without having to tolerate resist tear-offs or an unfavorable resist coverage in the region of steps or topographies. As an alternative, at least one depression, which does not fully penetrate sacrificial layer 64, may be produced in sacrificial layer 64 before first electrode-material layer 68 is deposited, and the depression then be completely filled with material of first electrode-material layer 68. With the aid of a subsequently executed CMP method, second electrode-material layer 68 is removed outside the introduced depression such that an external surface of second sacrificial layer 64 is exposed and a planar surface is produced. This makes it possible to create structures out of first electrode-material layer 68 which are developed as electrically insulated/separated from one another by material of second sacrificial layer 64.

A clearance between first stator electrode 22 and the subsequently formed first actuator electrode 18 is able to be adjusted with the aid of a layer thickness of third sacrificial layer 70.

At least one lateral etch-stop structure 56 may optionally be developed in third sacrificial layer 70 circumferentially around at least cavity region 12, this being accomplished by structuring at least one uninterrupted recess through third sacrificial layer 70 and then at least partly filling it with etch-stop material 66. A projection of etch-stop material 66 outside the later region of the at least one lateral etch-stop structure 56 can then be removed. As an alternative, prior to producing the at least one lateral etch-stop structure 56, an additional polysilicon layer is able to be deposited on third sacrificial layer 70, whereupon at least one uninterrupted recess through the additional polysilicon layer and third sacrificial layer 70 is developed, which subsequently is at least partly filled with etch-stop material 66. Providing the additional polysilicon layer makes it possible to avoid an uncontrolled etching attack on third sacrificial layer 70 when etch-stop material 66 is removed outside the later region of the at least one lateral etch-stop structure 56.

Next, second electrode-material layer 40, preferably a polysilicon layer, is able to be deposited, from which first actuator electrode 18 and possibly also a further subsection of later first suspension structure 20, a further subsection of the at least one later through-contact 46, and/or at least one reference electrode 34, and/or at least one circuit-trace structure is/are formed. A fourth sacrificial layer 72, preferably a silicon dioxide layer, is deposited on second electrode-material layer 40. Through the structuring of at least one uninterrupted recess through fourth sacrificial layer 72, a form and position of at least one later anchoring structure 62, at least one lateral etch-stop structure 74, a further subsection of later first suspension structure 20, and/or a further subsection of the at least one later through-contact 46 is/are able to be specified. In addition, a later electrode clearance between first actuator electrode 18 and third stator electrode 32 can be specified with the aid of a layer thickness of fourth sacrificial layer 72. Optionally, an additional silicon dioxide layer may be deposited before fourth sacrificial layer 72 of silicon dioxide is deposited and planarized in such a way that an external surface of first actuator electrode 18 is exposed and a planar surface is created. This offers the advantage that structure widths of the regions to be filled in second electrode-material layer can be selected independently of a layer thickness of fourth sacrificial layer 72.

Then, the above-described third electrode-material layer 44, e.g., a polysilicon layer, is deposited and planarized in an optional manner. From third electrode-material layer 44, third stator electrode 32 and possibly also at least one anchoring structure 62, at least one lateral etch-stop structure 74, the subsection of the later first suspension structure 20, the subsection of the at least one later through-contact 46, and/or the at least one reference counter-electrode 38, and/or at least one circuit trace structure may be formed.

As can also be gathered from FIG. 6A at least one cavity 76 may be developed to accelerate an etching step carried out later for exposing cavity region 12 in the plane of third electrode-material layer 44. For the at least one later cavity 76 as well, an uninterrupted recess through third electrode-material layer 44 is able to be structured, which frames assigned later cavity 76. In a next step, the at least one uninterrupted recess is filled with a sacrificial-layer material 78, in the process of which the at least one framed region of third electrode-material layer 44 is also covered with sacrificial-layer material 78. Only at least one etching channel 80 is structured through sacrificial-layer material 78 so that the at least one framed region of third electrode-material layer 44 is able to be removed with the aid of an isotropic plasma-etching step via individually assigned etching channel 80, which makes it possible to create/expose the at least one cavity 76.

Next, a fifth sacrificial layer 82, e.g., a silicon dioxide layer, is deposited and structured. The at least one etching channel 80 may be sealed at least with the aid of fifth sacrificial layer 82 such that the at least one cavity 76 is unable/barely able to be filled with the sacrificial-layer material of fifth sacrificial layer 82. Optionally, an additional sacrificial layer may be deposited and structured to close the at least one cavity 76 before fifth sacrificial layer 82 is deposited. A clearance between third stator electrode 32 and second actuator electrode 24 (formed later) is able to be specified via a layer thickness of fifth sacrificial layer 82. With the aid of at least one uninterrupted recess structured through fifth sacrificial layer 82, a form and position of at least one later anchoring structure 62, at least one lateral etch-stop structure 74, a further subsection of the later second suspension structure 28, and/or a further subsection of the at least one later through-contact 46 is/are able to be specified.

In the next step, the deposition, possibly the planarization and the structuring of the above-described fourth electrode-material layer 42 such as a polysilicon layer takes place. From fourth electrode-material layer 42, at least second actuator electrode 24 and possibly also the at least one counter-electrode 36, at least one lateral etch-stop structure 74, at least one circuit trace structure, at least one anchoring structure 62, the subsection of the later second suspension structure 28 and/or the subsection of the at least one later through-contact 46 is/are formed.

The present method continues with the deposition of a sixth sacrificial layer 84, in particular a silicon dioxide layer. With the aid of sixth sacrificial layer 84, a clearance is specified between second actuator electrode 24 and second stator electrode 26. If at least one lateral etch-stop structure 56 surrounding at least cavity region 12 in sixth sacrificial layer 84 is desired, then at least one uninterrupted recess is able to be structured through sixth sacrificial layer 84 and at least partly filled with etch-stop material 66. As an alternative, an additional polysilicon layer may be deposited on sixth sacrificial layer 84 before the at least one lateral etch-stop structure 56 is produced, whereupon at least one uninterrupted recess through the additional polysilicon layer and sixth sacrificial layer 84 is developed, which is subsequently at least partly filled with etch-stop material 66. The provided additional polysilicon layer makes it possible to avoid an uncontrolled etching attack on seventh sacrificial layer 84 when etch-stop material 66 is removed outside the later region of the at least one lateral etch-stop structure 56.

Next, a fifth electrode-material layer 88 is deposited and structured in such a way that second stator electrode 26 and possibly also at least one circuit trace structure, a further subsection of later second suspension structure 28, and/or a further subsection of the at least one later through-contact 46 is/are developed out of fifth electrode-material layer 88. Fifth electrode-material layer 88 may be a polysilicon layer.

In the next step, a seventh sacrificial layer 90 such as a silicon dioxide layer is deposited and possibly planarized. A corresponding structuring of seventh sacrificial layer 90 and a deposition of etch-stop material 66 allows for the development of at least one lateral etch-stop structure 56 also in the plane of seventh sacrificial layer 90. As an alternative, an additional polysilicon layer may be deposited on seventh sacrificial layer 90 before the at least one lateral etch-stop structure 56 is produced, whereupon at least one uninterrupted recess is developed through the additional polysilicon layer and seventh sacrificial layer 90, which is subsequently at least partly filled with etch-stop material 66. Providing the additional polysilicon layer makes it possible to avoid an uncontrolled etching attack on seventh sacrificial layer 90 when etch-stop material 66 is removed outside the later region of the at least one etch-stop structure 56.

The at least one lateral etch-stop structure 56 placed in at least the plane of seventh sacrificial layer 90 may possibly also satisfy the function of a diffusion/moisture barrier at a later point in time and prevent the entry of moisture into the layer system. With the aid of at least one uninterrupted recess structured through seventh sacrificial layer 90, it is also possible to specify a form and position of a further subsection of the later second suspension structure 28 and/or a further subsection of the at least one later through-contact 46.

In the following step, second diaphragm-material layer 50, e.g., a polysilicon layer, is deposited and optionally planarized, from which second layer 30, the subsection of the later second suspension structure 28, the subsection of the at least one later through-contact 46, and/or, optionally, at least one circuit trace structure is/are able to be formed. This is accomplished in that the previously exposed regions in seventh sacrificial layer 90 are also filled with polysilicon when the deposition of second diaphragm-material layer 50 is carried out.

Then, an eighth sacrificial layer 94, e.g., of silicon dioxide, may be deposited on second diaphragm-material layer 50 and optionally planarized and structured. A semiconductor-material layer 96, in particular a polysilicon layer, may possibly also be deposited on eighth sacrificial-material layer 94. The intermediate product is shown in FIG. 6A. Providing eighth sacrificial-material layer 94 and semiconductor-material layer 96 makes it possible to avoid mechanical damage to second layer 30, in particular during the exposure process of first layer 16 by the at least local removal of substrate 52 (see FIG. 6B).

Via at least one etching access (not sketched), cavity region 12 is able to be exposed by removal of at least a portion of the sacrificial-layer material of sacrificial layers 60, 64, 70, 72, 78, 82, 84, and 90, such as with the aid of HF gas-phase etching. Because of the development of the at least one cavity 76, the respective etching medium such as gaseous HF is able to distribute relatively quickly across a large volume, thereby allowing for rapid etching of the sacrificial layer.

The exposure of cavity region 12 is followed by the media-tight sealing of the etching access (not sketched), the provision of at least one bond-pad structure 54, e.g., made of aluminum, AlCu and/or AlCu and/or AlSiCu, and the exposing of second layer 30 by an at least local removal of semiconductor-material layer 96 and, optionally, eighth sacrificial-material layer 94. The intermediate product is shown in FIG. 6C.

The sealing of the at least one etching access after cavity region 12 has been exposed is able to be accomplished by depositing a sealing layer or with the aid of a laser melting method in a defined atmosphere under a defined pressure. This is not illustrated, however.

Figure 7:
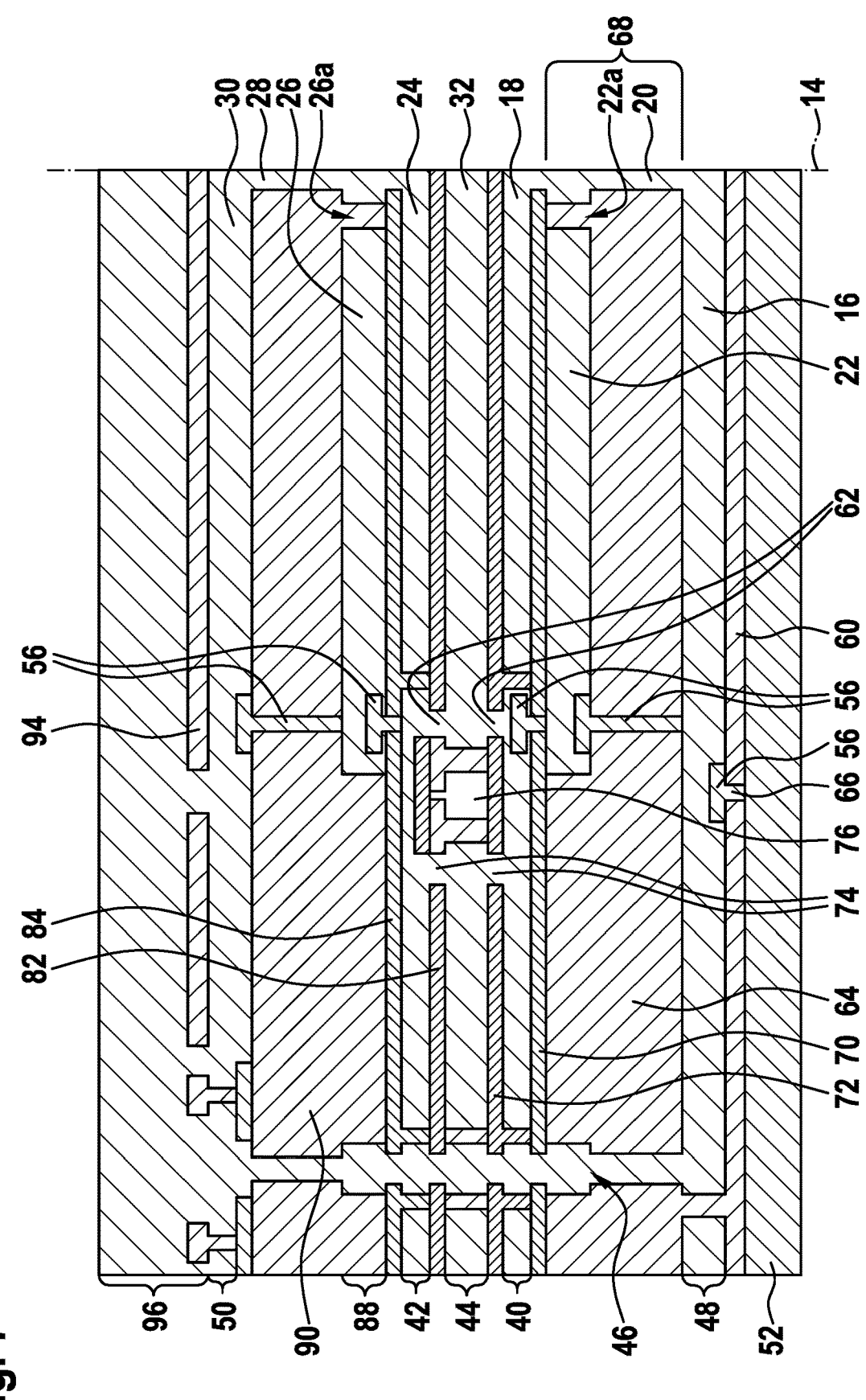
FIG. 7 shows a schematic partial representation of an intermediate product to describe a second embodiment of the production method for a micromechanical component of the present invention.

FIG. 7 shows a schematic partial representation of an intermediate product to describe a second embodiment of the production method for a micromechanical component.

In the production method of FIG. 7, after the first sacrificial layer has been deposited, the at least one lateral etch-stop structure 62 positioned in first sacrificial layer 60 is formed by the deposition of etch-stop material 66. In this case, as well, silicon-rich silicon nitride is able to be used as etch-stop material 66.

With regard to further features of the production method of FIG. 7 and its advantages, reference is made to the description of FIGS. 6A to 6C.

Figure 8:
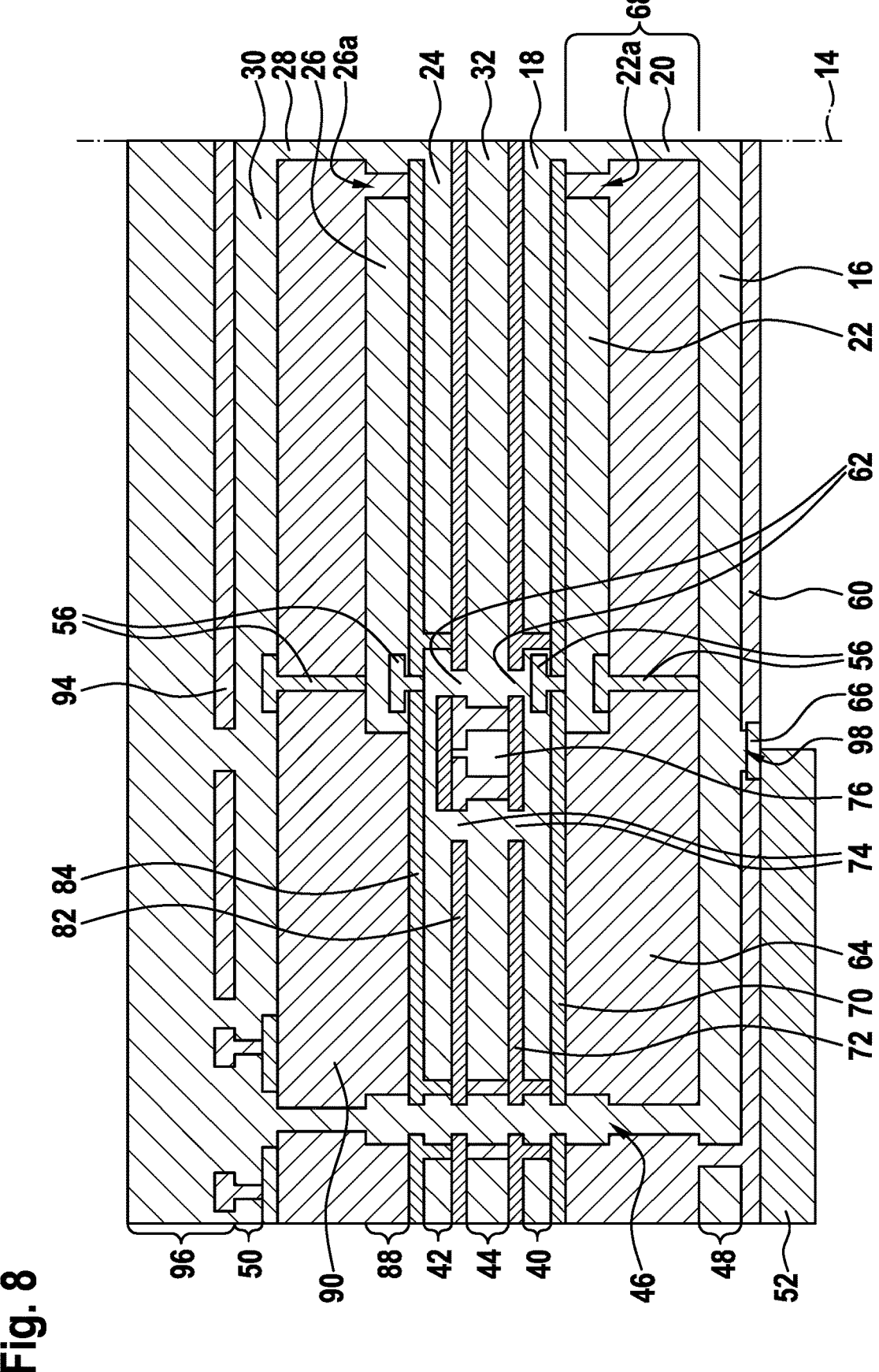
FIG. 8 shows a schematic partial representation of an intermediate product to describe a third embodiment of the production method for a micromechanical component of the present invention.

FIG. 8 shows a schematic partial representation of an intermediate product to describe a third embodiment of the production method for a micromechanical component.

As may be gathered from FIG. 8, the at least one lateral etch-stop structure 98 placed in first sacrificial layer 60 may likewise be developed by initially depositing an etch-stop material 98 on substrate 52 and optionally structuring it, and the at least one uninterrupted recess structured in first sacrificial layer 60 ends in its entirety in a region made from etch-stop material 60. A remaining residual volume of the at least one uninterrupted recess may subsequently be filled by depositing diaphragm-material layer 49 using its material. In this way, the at least one lateral etch-stop structure 98 is able to be developed as a solid anchoring region, which is electrically insulated from substrate 52.

With regard to further features of the production method of FIG. 8 and its advantages, reference is made to the description of FIGS. 6A to 6C.

When executing each of the afore-described production methods, lateral etch-restriction structures 56 may optionally also be formed from silicon and silicon-rich silicon nitride, as illustrated in FIG. 4A. The used polysilicon layers may optionally also be doped to obtain better conductivity. Preferably, sacrificial layers 64 and 90 are furthermore developed with a layer thickness that is considerably greater than each of the layer thicknesses of sacrificial layers 70, 72, 82 and 84, thereby contributing to an increase in a measuring signal induced by the deformation of first layer 16 and/or second layer 30.

What is claimed is:

1. A micromechanical component for a sensor and/or microphone device, comprising:

a housing structure;

a first actuator electrode, which is adjustable in relation to the housing structure and is suspended via at least one first suspension structure on an at least regionally deformable first layer;

a first stator electrode, which is fixed in place on and/or in the housing structure and is electrically contactable with the first actuator electrode such that a first measuring signal is able to be tapped with regard to a first voltage or capacitance applied between the first actuator electrode and the first stator electrode; and a second actuator electrode, which is electrically contactable with the first stator electrode and/or a second stator electrode fixed in place on and/or in the housing structure in such a way that a second measuring signal is able to be tapped with regard to a second voltage or capacitance applied between the second actuator electrode and the first stator electrode or between the second actuator electrode and the second stator electrode;

wherein, on a side of the first actuator electrode facing away from the first layer, the second actuator electrode is situated in an adjustable manner in relation to the housing structure in that the second actuator electrode is suspended via at least one second suspension structure on the first actuator electrode and/or an at least regionally deformable second layer, which lies on a side of the second actuator electrode facing away from the first actuator electrode, and wherein the first stator electrode lies between the first actuator electrode and the first layer, and the at least one first suspension structure extends through at least one first opening developed in the first stator electrode, and the second actuator electrode is electrically contactable with the second stator electrode in such a way that the second measuring signal is able to be tapped with regard to the second voltage or capacitance applied between the second actuator electrode and the second stator electrode.

2. The micromechanical component as recited in claim 1, wherein the first layer has a first flexural stiffness, which deviates from a second flexural stiffness of the second layer.

3. The micromechanical component as recited in claim 1, wherein the at least one first suspension structure is mechanically linked with the at least one second suspension structure in such a way that the first layer is coupled with or connected to the second layer in an electrically conductive or electrically insulating manner.

4. The micromechanical component as recited in claim 1, wherein the second stator electrode lies between the second actuator electrode and the second layer, and the at least one second suspension structure extends through at least one second opening developed in the second stator electrode.

5. The micromechanical component as recited in claim 4, further comprising a third stator electrode, which is fixed in place on and/or in the housing structure and lies between the first actuator electrode and the second actuator electrode, and the first actuator electrode is electrically contactable with the third stator electrode in such a way that a third measuring signal is able to be tapped with regard to a third voltage or capacitance applied between the first actuator electrode and the third stator electrode, and the second actuator electrode is electrically contactable with the third stator electrode in such a way that a fourth measuring signal is able to be tapped with regard to a fourth voltage or capacitance applied between the second actuator electrode and the third stator electrode.

6. The micromechanical component as recited in claim 1, wherein the second stator electrode lies between the first actuator electrode and the second actuator electrode.

7. A production method for a micromechanical component for a sensor and/or microphone device, comprising the following steps:

suspending a first actuator electrode via at least one first suspension structure on an at least regionally deformable first layer in such a way that the first actuator electrode is adjustable in relation to a housing structure;

fastening a first stator electrode on and/or in the housing structure;

developing a first electrical contacting for the first actuator electrode and the first stator electrode in such a way that a first measuring signal is able to be tapped with regard to a first voltage or capacitance applied between the first actuator electrode and the first stator electrode;

developing a second electrical contacting for a second actuator electrode and the first stator electrode or a second stator electrode fixed in place on and/or in the housing structure in such a way that a second measuring signal is able to be tapped with regard to a second voltage or capacitance applied between the second actuator electrode and the first stator electrode or between the second actuator electrode and the second stator electrode;

situating the second actuator electrode on a side of the first actuator electrode facing away from the first layer by suspending the second actuator electrode via at least one second suspension structure on the first actuator electrode and/or an at least regionally deformable second layer, which lies on a side of the second actuator electrode facing away from the first actuator electrode, such that the second actuator electrode is adjustable in relation to the housing structure, wherein the first stator electrode is situated between the first actuator electrode and the first layer, and the at least one first suspension structure is guided through at least a first opening developed in the first stator electrode, and the second electrical contacting is developed in such a way that the second measuring signal is able to be tapped with regard to the second voltage or capacitance applied between the second actuator electrode and the second stator electrode.

8. The production method as recited in claim 7, wherein the first layer is developed with a first flexural stiffness, and the second layer is developed with a second flexural stiffness such that the first flexural stiffness of the first layer deviates from the second flexural stiffness of the second layer.

* * * * *